United States Patent [19]
Roy

[11] Patent Number: 5,539,349
[45] Date of Patent: Jul. 23, 1996

[54] METHOD AND APPARATUS FOR POST-FABRICATION ASCERTAINING AND PROVIDING PROGRAMMABLE PRECISION TIMING FOR SENSE AMPLIFIERS AND OTHER CIRCUITS

[75] Inventor: Richard S. Roy, Danville, Calif.

[73] Assignee: Hitachi Microsystems, Inc., San Jose, Calif.

[21] Appl. No.: 217,382

[22] Filed: Mar. 24, 1994

[51] Int. Cl.$^6$ ............................................. H03H 11/26
[52] U.S. Cl. ........................................ 327/276; 327/278
[58] Field of Search ............................. 371/22.2, 22.3, 371/22.6; 327/276, 278, 525

[56] References Cited

U.S. PATENT DOCUMENTS

| | | | |
|---|---|---|---|
| 5,014,226 | 5/1991 | Horstmann et al. | 371/22.6 |
| 5,341,382 | 8/1994 | Levitt | 371/22.6 |
| 5,359,547 | 10/1994 | Cummins et al. | 371/22.3 |
| 5,369,646 | 11/1994 | Shikatani | 371/22.6 |
| 5,376,849 | 12/1994 | Dickol et al. | 327/278 |

*Primary Examiner*—Margaret Rose Wambach
*Attorney, Agent, or Firm*—Flehr, Hohbach, Test, Albritton & Herbert

[57] ABSTRACT

The present invention includes a variable delay element that can be programmed by a combination of control signals whose values may be determined by a matrix of programming elements, preferably fuses. In a TEST mode, a multiplexer array decouples the matrix, and instead couples a combination of user provided TEST mode control signals to the variable delay element. TEST mode permits selection of a suitable delay by observing the effect on IC functionality of all available values of delay provided by these TEST mode user-provided control signals. Once a suitable delay has been determined, the matrix may be programmably altered to permanently store and provide to the variable delay element the appropriate pattern of control signals to produce such delay.

19 Claims, 4 Drawing Sheets

METHOD AND APPARATUS FOR POST-FABRICATION ASCERTAINING AND PROVIDING PROGRAMMABLE PRECISION TIMING FOR SENSE AMPLIFIERS AND OTHER CIRCUITS

FIELD OF THE INVENTION

This invention relates to providing precision programmable timing delays to integrated circuits post-fabrication, and more specifically to ascertaining and providing on-chip digitally maintained programmed precision timing delays for integrated circuits.

BACKGROUND OF THE INVENTION

Integrated circuit ("IC") chips often include circuits that must respond within a desired time window upon receipt of a clock signal. For example, a memory IC chip may include a plurality of memory cells arranged in rows and columns, with sense amplifiers coupled between complementary column bit line pairs. Upon receipt of a sense enable signal, the sense amplifiers are enabled and must develop and provide the true state of the memory cell being read as a latched output signal. This sense enable signal can be a delayed version of an input clock signal. If the time delay is too short and the sense amplifiers are enabled too soon, the true stored value cannot be reliably read under all circumstances. If the sense amplifiers are enabled too late, access and system cycle times are delayed, time is wasted, and the monetary value of the IC containing the sense amplifiers can be diminished.

Using simulation techniques, an initial anticipated timing delay is determined for the prototype fabrication of a given IC design. In practice, determining the precise amount of delay required for an IC chip is not always easy to discern. More specifically, semiconductor process variations, defects, and system offsets can inject uncertainty into predicting the required delay. After fabrication, prototype wafers are thoroughly characterized by extensive testing under extreme timing and environmental conditions, and the actual nominal desired delay can generally be approximated.

Based on the characterization results, the subsequent production masks can be altered to permanently provide an amount of delay that hopefully is sufficiently close to the actual nominal desired delay for mass production. The prior art attempts to so provide the proper delay by modifying only the metallization. However, often other layers must also be modified to produce a time delay closer to the desired value determined by characterization.

But although all sense amplifiers on all wafers are subjected to the same metallization-fixed delay, the actual required delay may differ among the fabricated sense amplifiers. Ideally, all memory cells fabricated on different wafers should be equally fast in generating adequate signals to the sense amplifier inputs for reliable sensing with an optimally delayed latch signal. However, fabrication process variations, semiconductor defects and system offsets exist. Some defects are sufficiently severe that the chip cannot be salvaged, e.g., a Vcc-to-ground short. However, a statistically significant number of defects merely slow the generation of proper signals, e.g., the time required to generate sufficient signal from a memory cell onto the associated bit lines.

These variables can result in some individual IC chips having one or more sense amplifiers that will function correctly, but at a slower speed than the bulk of the sense amplifiers located elsewhere on that chip. Faster responding ICs are potentially more valuable than the slower responding ICs, and can generally be sold for a higher price. Although the slower responding ICs can still be used in applications permitting a longer delay between latch signal input and sense amplifier output, such ICs may command a lower sales price.

The prior art metallization pattern technique for fixing delay is relatively inflexible and does not permit customizing the delay after IC fabrication is complete. If the metallization-fixed delay is too short, IC chips containing defectively slow but still functional sense amplifiers may be enabled too soon. As such, these sense amplifiers would not provide a proper output signal, and the IC would therefore not be functional. In the prior art, such IC chips generally cannot be salvaged. However, if the delay could be increased after fabrication, a significant number of these chips could still be functional, albeit at a slower speed.

Further, while prior art techniques may provide an appropriate nominal delay for some of the sense amplifiers on some of the IC chips, this delay may be unnecessarily long for sense amplifiers on other identical chips. Thus, although these other sense amplifiers would be fully functional with a shorter time delay, they nonetheless are compelled to operate with an unnecessarily long nominal delay. These under-utilized chips must then be sold for a smaller price than if they could be operated at a reduced delay time. In essence, the prior art delay technique must sacrifice yield, speed, or both.

What is needed is a test mode method for ascertaining actual optimum delay for a fabricated IC on a per chip basis. Such delay should then be individually programmable with an acceptable degree of delay resolution, again on a per-IC chip basis after fabrication is complete. So doing would permit post-fabrication customization of the time delay to meet the needs of the faster, defect-free chips by providing shorter delays, yielding IC chips with faster access times. Further, such method would permit extending the delay to maintain functionality of slower IC chips that may contain small defects that delay sensing or generation of a read signal.

The present invention provides such a method and system that satisfies these needs.

SUMMARY OF THE PRESENT INVENTION

The present invention provides an on-chip variable delay element that creates a time delay in response to a set of control signals provided from a programming means. The programming means preferably includes a matrix of programmable elements, a multiplexer array and optional combinational logic. The variable delay element outputs a delayed version of an input signal.

In overview, a TEST mode procedure carried out on a per-chip basis after fabrication enables determination of an optimum time delay. This delay is then programmed into the programming means, whereupon the IC chip operates thereafter with the optimum time delay.

More specifically, in NORMAL mode operation, the multiplexer array causes the control signals to be determined by the output signals of the matrix of programmable elements. The matrix includes m programmable elements that are preferably fuses. The matrix couples up to $2^m$ combinations of fixed "0" or "1" matrix output signals via the multiplexer array and an optional combinational logic unit to the variable delay element in NORMAL mode operation.

The default values of these matrix output signals preferably are determined by the metallization pattern of the integrated circuit chip containing the present invention. Further, these matrix output signals may be altered after IC fabrication to change the delay provided by the variable delay element. For example, if the programmable elements are fuses, select fuses may be blown to re-program the matrix, thus causing a desired change in the time delay.

In TEST mode, on a per-chip basis, the multiplexer array decouples the matrix from the variable delay element, which is instead coupled to up to $2^m$ varying combinations of "0" or "1" output signals resulting from m distinct user-provided TEST mode programming input signals. In the TEST mode, all possible combinations of the TEST mode programming input signals (which correspond to the same combinations of the matrix output signals) can be provided to the variable delay element, which varies its delay accordingly.

During TEST mode, the IC response is checked to determine circuit functionality for each of the various delays. Based on these results, a suitably small time delay resulting in acceptably reliable IC performance can be determined. The matrix can then be altered, preferably by blowing a pattern of fuses, to permanently provide matrix output signals that duplicate the TEST mode output signals that have been ascertained to provide the desired time delay.

In either mode, the combination of "0" or "1" signals provided by the multiplexer array (through the optional combinational logic) to the variable delay element determines the resultant time delay. The programmed delay is quantized into $2^m$ values, ranging from a minimum delay to a maximum delay, preferably in substantially equal time increments.

In NORMAL mode operation of the present invention, an input signal is received by the variable delay element, which also receives appropriately matrix-determined control signals from the matrix array. The variable delay element then provides as an output the properly delayed signal, which may be coupled to other circuits on the same chip, e.g., to sense amplifiers requiring the delayed signal as a clock (or enable) signal for proper read out.

Other features and advantages of the invention will appear from the following description in which a preferred embodiment has been set forth in detail in conjunction with the accompanying drawings.

DETAILED DESCRIPTION OF THE PREFERRED EMBODIMENTS

Figure 1:
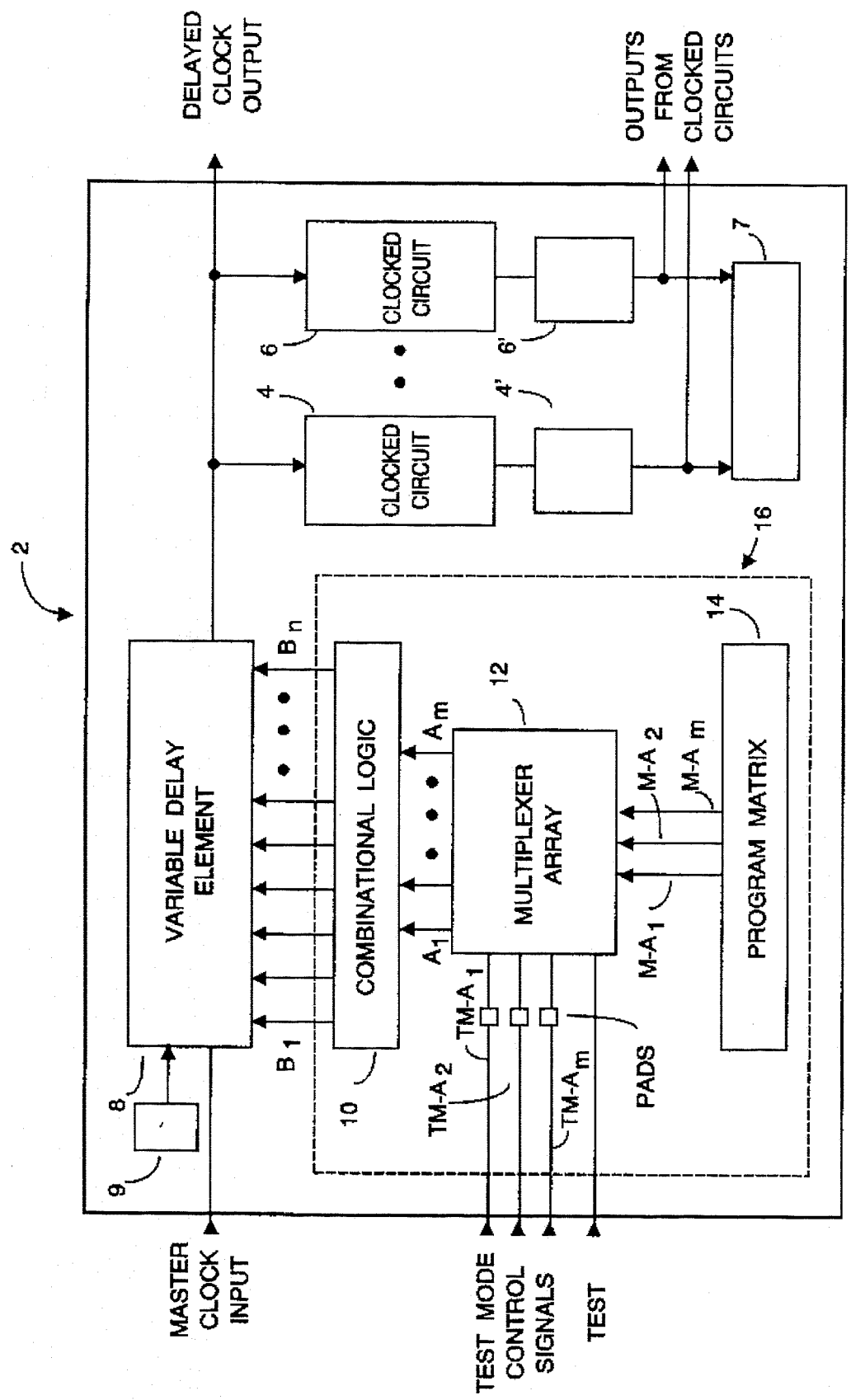
FIG. 1 depicts an IC chip containing a variable delay element, and programming means comprising a matrix of programmable elements, multiplexer array and optional combinational logic, according to the present invention.

FIG. 1 depicts an integrated circuit ("IC") chip 2 that includes a variable delay element 8 that receives an input signal that, after suitable delay, is coupled to a number of clocked on-chip circuits 4, 6, and may also be coupled off-chip. In the described embodiments, the input signal is preferably a master clock signal, generated on-chip, e.g., by element 9, or provided directly from off-chip. According to the present invention, chip 2 further includes a variable delay element 8, as well as a programming means 16 that comprises optional combinational logic 10, a multiplexer array 12 and a matrix 14 containing m programmable elements, collectively 18 (see FIG. 2).

The variable delay element 8 receives the master clock input and generates the delayed clock output, in response to a pattern of "0's" and "1's", denoted control signals $B_1-B_n$, provided by multiplexer array 12, preferably via optional combinational logic 10. In NORMAL mode operation, the multiplexer array 12 couples the matrix 14 to the variable delay element 8 (again, preferably via optional combinational logic 10). The time delay of variable delay element 8 is thus determined by the matrix. In TEST mode, matrix 14 is decoupled and the multiplexer array 12 instead couples user-provided TEST mode control signals to the variable delay element 8, again preferably via optional combinational logic 10.

In FIG. 1, combinational logic 10 receives as input control signals $A_1-A_m$, from the output of multiplexer array 12. In a TEST mode, when the signal TEST=1, $A_1-A_m$ replicate TEST mode signals, denoted TM-$A_1$ to TM-$A_m$. In NORMAL mode, e.g., non-TEST mode, the $A_1-A_m$ signals output by the multiplexer array replicate program matrix 14 output signals, denoted M-$A_1$ through M-$A_m$.

The number of output control signals $B_1-B_n$ provided by the optional combinational logic 10 to the variable delay element 8 is independent of the number of input control signals $A_1-A_m$. For example, if m=3, combinational logic 10 could provide up to $2^3$ different useable combinations of output control signals $B_1-B_n$. In the described embodiment, m=3, and circuit 10 is a combinational logic element that creates n=6 different outputs $B_1-B_6$, having eight unique combinations of "1's" and "0's". The number (n) of control signals required to adequately program the variable delay element 8 will depend upon how element 8 is implemented.

Figure 3:
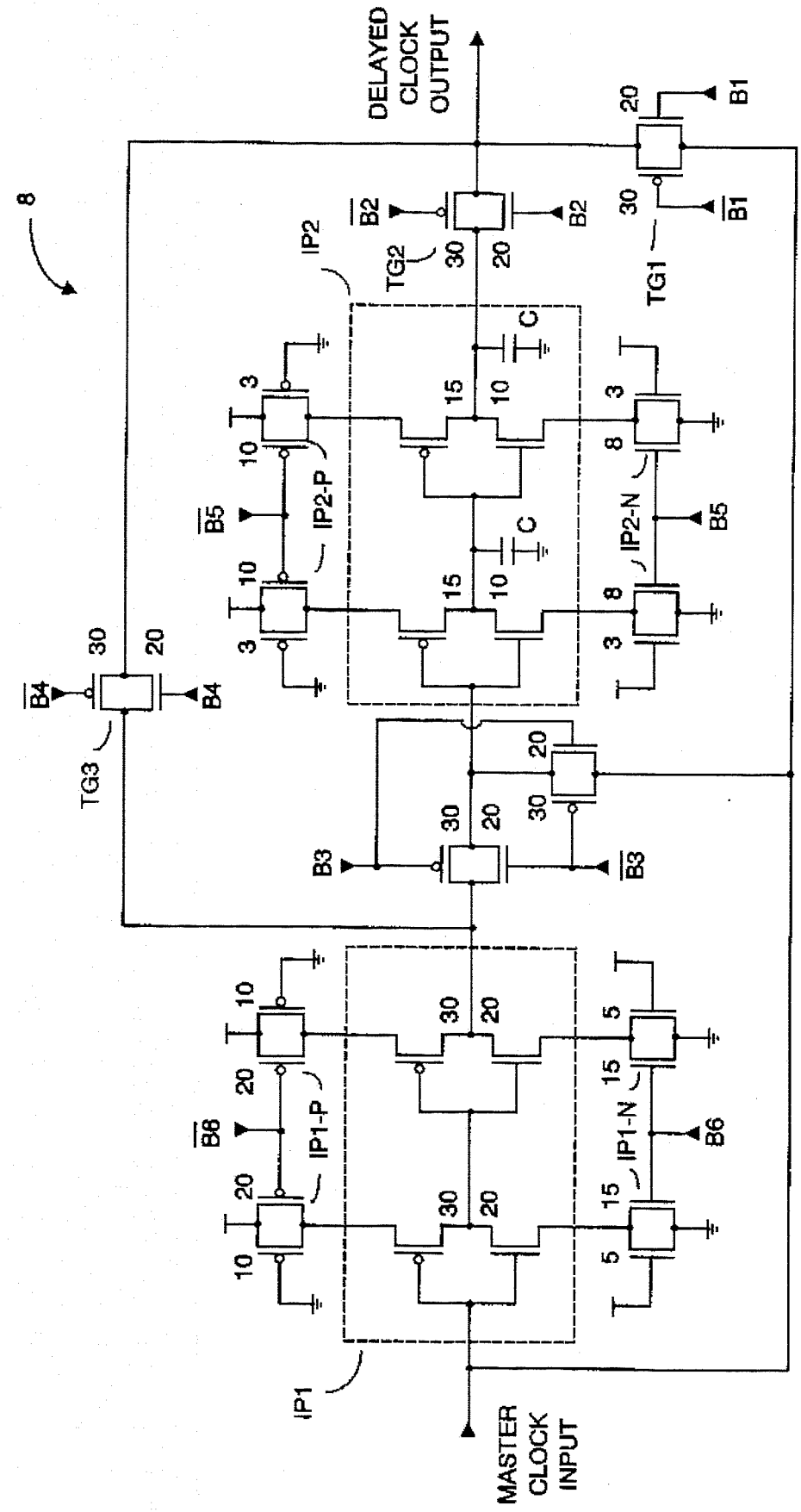
FIG. 3 is a schematic of one embodiment of a variable delay element for inserting one of eight ($2^3$) delay values into the delayed clock output signal, according to the present invention.

For the embodiment of variable delay element 8 depicted in FIG. 3 (to be described), m=3, and n=6 control signals $B_1-B_6$ were sufficient to provide eight ($2^3$) quantized smoothly graded time delays. However, the number n can be anywhere in the range of three to eight or more.

The design of such combinational logic is known to those skilled in the art of logic design. However, a brief view of how combinational logic 10 may be implemented is provided later herein, with respect to TABLE 2.

Although FIG. 1 shows the TEST mode signal as being generated off-chip, it may in fact be created on chip 2. Further, depending upon the application, there may be no need to provide the delayed clock output signal off-chip, as depicted in FIG. 1. It is understood that chip 2 may include other circuitry, and may receive and provide other input and output signals, including for example power supply voltages, address inputs, data inputs/outputs, and control signals.

In one embodiment, chip 2 includes a plurality of memory cells (not shown) coupled to the clocked circuits 4, 6, which preferably are sense amplifiers. However, it will be appreciated that clocked circuits 4, 6 may be any circuit to which it is necessary to deliver a delayed version of some other signal, usually an on- or off-chip input signal. As shown in FIG. 1, buffer circuitry 4', 6' is generally provided to drive large capacitive loads, which loads may be on-chip or off-chip. It will also be appreciated that although FIG. 1 depicts but a few clocked circuits 4, 6, in reality chip 2 may contain thousands of such circuits.

Many integrated circuit applications can benefit from the precision timing provided by the present invention, including memory circuits and high speed circuits such as high performance processors. However, the embodiment described will focus on use of the present invention in memory circuit implementations.

As is commonly known to those skilled in the art of memory design, a memory IC includes a plurality of memory cells, addressably arranged in rows and columns. Sense amplifiers are coupled between complementary column bit lines to read-out "0" or "1" values stored in the memory cell being addressed. In a READ mode, the appropriate memory cells and sense amplifiers are enabled. Then, typically after a few ns delay, the memory cells will develop signals sufficiently large to allow the sense amplifiers to correctly latch the small signal generated by addressed memory cells for proper read-out of the stored "0" or "1" values.

In the context of FIG. 1, arrival of the master clock input signal may coincide with the beginning of signal generation by the memory cells in READ mode. Receipt of a suitably delayed clock signal at the sense amplifier 4 or 6 will cause the latched signal to be correctly read out from the memory cell. Those skilled in the relevant art will appreciate that too small a delay may not guarantee complete signal generation from the memory cell to the bit lines. Further, the necessary time delay may be different from wafer to wafer, from IC chip to IC chip fabricated on the same wafer, or even among bit line pairs on the same IC chip. If the memory cells, bit lines, and sense amplifiers were perfectly fabricated and infinitely fast, the amount of delay necessary could be extremely small, perhaps on the order of one or two fast inverter delays (<1 ns with present complementary metal-oxide-semiconductor ("CMOS") technology).

However, fabrication variables including defects in the semiconductors comprising the relevant circuits on chip 2 dictate that a delay is necessary before the sense amplifier can be read-out with certainty. Such delay typically corresponds to several inverter delays (e.g., perhaps 3–5 ns with present CMOS technology). For chips with defects, correct sensing may require 10–15 ns.

Although a sufficiently large fixed delay could be implemented, perhaps 15 ns, to allow even the slowest sense amplifiers to develop a sufficient latching signal before read-out occurs, so doing would reduce the performance and hence selling price of chip 2.

The present invention causes IC 2 to operate with the time delay determined during a post-fabrication TEST mode to be optimum for the particular IC. During TEST mode, matrix 14 output signals are bypassed by multiplexer array 12, and the optimum time delay is determined by varying user-provided TEST mode signals, TM-$A_1$, etc. Subsequently, the programmed elements 18 in matrix 14 are programmed to this optimum delay value to control variable delay element 8 (again, preferably via optional combinational logic 10). This creates the minimum required time delay that will be required during subsequent NORMAL mode operation.

Although FIG. 1 depicts IC 2 as including but a single version of the present invention, of course the present invention may be replicated in identical or modified versions multiple times on the chip. So doing would permit generating and providing different precision time delays for different types of circuits on IC chip 2.

Figure 2:
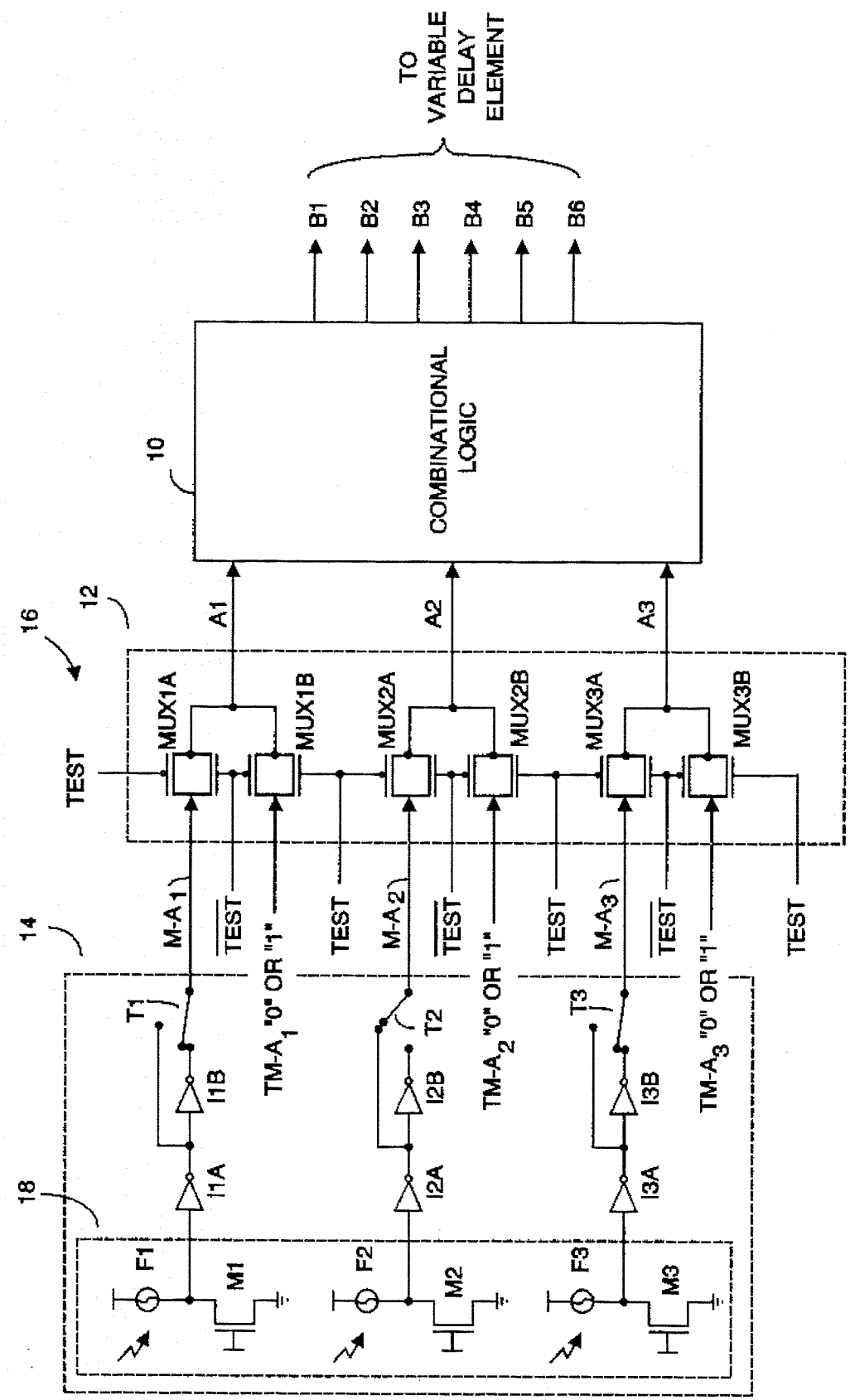
FIG. 2 depicts in detail the programming means of FIG. 1, for m=3 programmable elements, according to the present invention.

FIG. 2 depicts programming means 16 comprising program matrix 14 (which includes programming elements 18), multiplexer array 12 and optional combinational logic 10. Matrix 14 optionally includes metallization connection options, noted as T1–T3.

In FIG. 2, program matrix 14 is shown with three (e.g., m=3) programmable elements F1–F3 (collectively, 18), and associated optional metallization options T1–T3. Preferably F1–F3 are laser-blowable fuses. As such, matrix 14 provides m=3 binary output signals M-$A_1$, M-$A_2$, M-$A_3$, which of course may create $2^3$ usable combinations of control signals $B_1$ through $B_n$. As noted above, combinational logic 10 simply converts the three binary output signals into $2^3$ different usable combinations of "0" and "1" signals, $B_1$–$B_6$, which program the variable delay element 8 in NORMAL mode.

Use of combinational logic unit 10 is optional. One could match the number of programming elements to the number of control signals required to control the variable delay element 8. However, unit 10 advantageously permits the use of fewer programming elements 18 in the matrix 14. For example, the configuration of FIG. 2, which uses combinational logic unit 10, allows m=3 programming elements to program up to eight combinations of the six control signals, $B_1$–$B_6$. (As previously noted, n can be anywhere in the range of three to eight or more.)

Of course more or fewer binary output combinations $A_m$ could be provided, depending upon the granularity of delay resolution variable delay element 8 is to provide. Two binary signals $A_1$, $A_2$ would create up to $2^2$ or four levels of delay resolution, four binary signals would create up to 16 levels of delay resolution, and so on. In the embodiment of FIG. 2, the m=3 programming elements create eight levels of programmed delay granularity.

The initial metal pattern can select any one of the eight possible combinations M-$A_1$, M-$A_2$, M-$A_3$, producing any of eight time delays. In practice, no programming elements F1–F3 are programmed (e.g., blown), before IC testing. Before such programming, the initial M-$A_1$ to M-$A_3$ "0" or "1" values are determined respectively by the corresponding T-1 to T-3 metallization options. In the example of FIG. 2, T-1 is fabricated to produce M-$A_1$="1", but T-2 is fabricated to produce M-$A_2$="0". This is accomplished by coupling the M-$A_1$ line to the output of inverted I1B, but by coupling the M-$A_2$ line to the output of inverter I2A.

The metallization pattern delay is initially determined by simulation. However the metallization pattern may later be changed based upon results of characterization of engineering prototypes. Further, the metallization pattern may again be changed some time later in the mass production phase in response to the history of fuse blown patterns. For example, if a substantial number of the actual mass produced ICs require a matrix-programmed "1 -0-1" $A_1$-$A_2$-$A_3$ pattern to produce an appropriate time delay, but the original pattern is some other value, say 1-1-0, the metallization may be changed to provide "1-0-1" as the default value, as shown in FIG. 2. With this default value, preferably relatively few programming elements F1–F3 would then require actual programming, thus reducing testing costs and, ultimately, the cost of the final chips. It is understood that in practice relatively few elements F1–F3 should require the time and expense of programming once the production process has stabilized and the optimum default value has been determined.

During TEST mode (TEST=1), multiplexer MUX1A opens and multiplexer MUX1B closes. This overrides the matrix programmed condition, and causes multiplex array output signal $A_1$ to be whatever "0" or "1" user-provided TEST mode signal is presented to MUX1B as signal TM-$A_1$. In similar fashion, during TEST mode, multiplexer array output signals $A_2$ and $A_3$ will be whatever "0" or "1" is applied to MUX2B and MUX3B as user-provided TEST mode signals TM-$A_2$ and TM-$A_3$.

The user-provided TEST mode signals may be presented to multiplexer 12 in a variety of ways. For example, on-chip circuitry could logically create these signals in response to other logical input signals. If desired, unbonded pads ("PADS" in FIG. 1) could be provided for access during wafer test mode via the wafer probe card. In this example, the TEST mode signals could be provided directly to these PADS by the tester during the IC probing, the pads serving no useful function otherwise. Alternatively, input pads that serve some other function during NORMAL mode operation could be reconfigured during TEST mode to provide the user-provided TEST mode input signals to multiplexer array 12.

In response to the eight combinations of TM-$A_1$, TM-$A_2$, TM-$A_3$ signals coupled via multiplexer array 12 as $A_1$, $A_2$, $A_3$, and resultant control signals $B_1$–$B_6$, variable delay element 8 varies the time delay between the master clock input and the delayed clock output. The delay can range from a minimal value to a maximum value, and occurs in eight quantized steps, preferably substantially equal in time increment.

As each control combination is provided in TEST mode, the full IC 2 is tested for functionality and speed, a so-called "schmoo test" procedure, wherein simple functionality is measured in response to incrementally varied time delay. Based on the functional results of IC chip 2 as the different combinations of TM-$A_1$ to TM-$A_3$ are provided, the tester selects the appropriate time delay to provide a desired IC reliability margin. If this delay time is different from the combination initially programmed into fuse elements 18, the appropriate fuses may then be blown to alter the output of program matrix 14 to correspond to the newly determined optimum delay value.

The minimum necessary delay is determined by the IC manufacturer to correspond to quality and reliability specifications. For example, TEST mode is typically carried out in a low noise, low temperature environment, whereas the IC is expected to perform reliably under a wide range of conditions, e.g., wide temperature variations, noisy power sources, etc. In practice, the manufacturer may select and program a delay time that is in fact larger than the minimum delay that still results in a functional IC during TEST mode.

Another consideration affecting whether to program matrix 14 is whether a slight decrease in delay (obtained from matrix programming) results in a more valuable IC. For example, memory chips are typically graded in quantized speed increments. One such memory chip, static random access memory or "SRAM" may typically be sold in speed grades of 15 ns, 25 ns, and 35 ns. Therefore, a particular IC that could be sped-up from 33 ns to 28 ns by programming matrix 14 would not command a higher price, and the time and expense associated with matrix programming to achieve the 5 ns improvement would not be warranted.

However, if in TEST mode the IC was determined to function at 27 ns with default matrix programming, whereas programming matrix 14 could result in a reliable 22 ns chip, programming is justified because the resultant "25 ns grade" IC could be sold at a higher price.

On the other hand, an IC that is non-functional because the default delay is too short for proper sensing by one or more sense amplifiers may be salvaged by matrix programming to produce a suitably long delay. The resultant IC would then perform at a slower speed, but if the slower speed was still within the same speed gradation the IC sales price would be the same as a fully functional IC using the matrix/metallization default conditions.

Even if a slower delay pushed the previously non-functional IC into a slower speed gradation, benefits are realized. The more slowly performing IC could still be sold, albeit at a lower price. In either case, ICs that would be discarded in the prior art, can be salvaged using the present invention, and sold at a price perhaps equal to that of premium ICs. Thus, the effective yield and the revenue per wafer are increased using the present invention.

To recapitulate, once the appropriate TM-$A_1$, TM-$A_2$, TM-$A_3$ signals that produce a desired time delay for reliable operation of circuits 4, 6 (or other off-chip circuits) are determined, TEST mode ends. Taking into account the above considerations, matrix 14 may then be programmed to permanently provide the desired 000 to 111 $A_1$-$A_2$-$A_3$ pattern corresponding to the appropriate TM-$A_1$, TM-$A_2$, TM-$A_3$ pattern.

Assume, for example, that the metallization T1–T3 default pattern M-$A_1$ to M-$A_3$ is "1-0-1", but TEST mode determined that "1-1-1" would produce a more optimum time delay. If the various considerations warrant reprogramming, then program element F2 would be blown (e.g., "programmed"). It is apparent from FIG. 2, that if F2 is blown (e.g., open circuit), then transistor M2 provides a logical "0" to inverter I2A, which causes M-$A_2$ to be a "1". So doing produces a desired M-$A_1$ to M-$A_3$ "1-1-1" pattern, as desired.

From this time onward in the life of the particular IC chip, TEST=0, and NORMAL mode will always prevail, absent an attempt to try to re-test, re-schmoo and re-program elements F1–F3, which would only sensibly occur while IC 2 is still being driven by dedicated IC test machinery. In fact, TEST mode is only entered under special conditions when driven by the dedicated IC test machinery. It is important that circuitry creating the TEST signal be designed to preclude entering TEST=1 mode inadvertently.

In NORMAL mode, MUX1B, MUX2B, MUX3B open, but MUX1A, MUX2A and MUX3A close. Whether $A_1$, $A_2$, $A_3$ are now "0's" or "1's" depends upon the metal mask pattern (see T1, T2, T3 in FIG. 2), and the programmed or unprogrammed (e.g., open or closed) condition of programming elements F1–F3.

After programming, it is good practice to fully re-test IC 2 under the full range of production test electrical and environmental conditions.

In a preferred embodiment, programming elements F1, F2, F3 are laser-blowable fuses, coupled in series between a positive power source and the drain of a metal-oxide-semiconductor ("MOS") N-channel transistor M1, M2, or M3. For example, in FIG. 2, M1, M2, M3 are relatively high impedance, low current MOS devices. When the associated fuses are unprogrammed, e.g., intact, the low fuse impedances relative to the high MOS device impedances present logical "1" values to the inputs of inverters I1A, I2A, I3A. But when a fuse is blown (e.g., open), MOS devices M1, M2, M3 are sufficiently strong to guarantee logical "0" inputs to the associated inverters.

Assume in FIG. 2 that the metallization pattern is as shown, producing a NORMAL mode default $A_1$, $A_2$, $A_3$ pattern of "1-0-1". If TEST mode determines that a "1-1-1" pattern will optimize the time delay, and if fuse programming is warranted, F2 may be blown. With F2 blown, M-$A_2$ will be "1", and the multiplexer array 12 will output a "1-1-1" pattern to the optional combinational logic 10, whereupon the delay time of the variable delay element 8 will be modified accordingly.

Although fuses are depicted in FIG. 2, it will be appreciated that programming elements 18 may be any configuration of components that may be permanently modified to produce a desired pattern of outputs. Such components may include, without limitation, flash memory elements, antifuse elements, electrically programmable ROMs ("EPROMs").

In certain applications, zero DC current may be necessary under certain conditions, (e.g., "power down" when chip enable CE=0). In such applications, M1–M3 would be weak pulldown MOS devices, whose gate signals would be controlled by appropriately generated logic signals. These gate logic signals would be such that the program matrix 14 would be sampled as necessary, but not during the zero DC current mode. For example, the programmed element state (blown/unblown) may be sampled with a gate logic pulse signal, and the sampled value stored, for example in a CMOS latch. In this fashion, no further DC current would be required while the chip remained powered-up, such sampling occurring perhaps during a specified start-up cycle.

Having described how TEST mode can determine an optimum time delay, and how matrix 14 may be programmed to provide a pattern of control signals causing such delay to be permanently produced, the operation of variable delay element 8 will now be described with reference to FIG. 3 and TABLES 1 and 2, below.

FIG. 3 includes CMOS transistors coupled to form multiplexer transmission gates, programmable current sources, and first and second inverter pairs IP1 and IP2. The numerals placed by the sources of the various MOS transistors, e.g., "15", "15", reflect relative width/length ("W/L") scaling, according to the preferred embodiment. While other W/L scaling ratios may be used, it will be understood that MOS devices with a larger W/L ratio can generate more drain-source current and respond more quickly than a MOS device with a smaller W/L ratio. As shown by FIG. 3, a parasitic load capacitor C may be purposely coupled to the output of an inverter pair (IP2) to contribute additional time delay. Of course, capacitor C may be controllably coupled to or decoupled from an inverter output by using a transmission gate (not shown), thereby providing additional delay time flexibility and range.

As shown, circuit 8 receives a master clock input signal, a number of programming control signals $B_1, B_2 \ldots B_6$, and provides a delayed clock output signal whose delay from the master clock input is determined by these control signals, which are preferably received from combinational logic 10. In response to the pattern of "1's" and "0's" in the control signals, circuit 8 provides a delay ranging from a minimum delay (DELAY D0) to a maximum delay (DELAY D7), with intermediate values of delay, DELAYS D2–D6. The "DELAY D0–D7" nomenclature is used herein simply as a shorthand reference for the various amounts of quantized delay.

According to the present invention, circuit 8 provides variably delayed clock output signals by programmably routing the input clock signal through one of several possible pathways to the delayed clock output port. For example, the minimum time delay (D0 case) is provided in circuit 8 by routing the master clock input signal directly through a transmission gate TG1 gated by B1, $\overline{B1}$. So doing provides a minimum delay of perhaps <0.5 ns. For other delay cases, the master clock input signal may instead be routed through either inverter pair IP1 or IP2, or a series coupling of both inverter pairs IP1 and IP2. Preferably, each inverter pair may be caused to operate with different time delays, two such delays being shown in FIG. 3 per each inverter pair. For example, the perhaps >5 ns maximum delay (D7 case) is created by appropriate $B_5$, $\overline{B_5}$, $B_6$, $\overline{B_6}$ signals that cause each inverter pair to operate with the slowest time delay. Alternatively, other routing paths and/or source current settings can produce intermediate delays D1–D6, as determined by appropriate patterns of control signals $B_1$–$B_6$. As noted, the different delay states D0, D1, ... D7 quantize the time difference between maximum delay and zero delay into preferably substantially equal time increments.

Note in FIG. 3 that each of inverter pairs IP1 and IP2 includes PMOS load transistors IP1-P, IP2-P, that are parallel-coupled to IP1, IP2 respectively when $\overline{B_5}$=0 and $\overline{B_6}$=0. Thus, when $\overline{B_6}$=0, IP1 will exhibit a shorter delay time than when $\overline{B_6}$=1 because the circuit of FIG. 3 provides three times the source current to inverter pair IP1, and likewise for IP2 when $\overline{B_5}$=0. Similarly, IP1 and IP2 include NMOS source transistors IP1-N, IP2-N that are parallel coupled to IP1 and IP2 when $B_5$=1, and when $B_6$=1.

Table 1 indicates the various combinations of inverter pairs IP1 and IP2, including IP1-P, IP1-N, IP2-P, IP2-N that are operatively combined to produce the various delays D0–D7.

TABLE 1

| State | IP1 status | IP2 status | Comments |
|---|---|---|---|
| D0 | bypassed | bypassed | smallest delay produced, fastest case |
| D1 | IP1 produces fast delay | bypassed | fast IP1-N and IP1-P devices invoked |
| D2 | IP1 produces slow delay | bypassed | slow IP1-N/-P devices invoked, but still faster than fast setting of IP2 |
| D3 | bypassed | IP2 produces fast delay | fast IP2-N and IP2-P devices invoked |
| D4 | bypassed | IP2 produces slow delay | slow IP2-N and IP2-P devices invoked |
| D5 | IP1 produces fast delay | IP2 produces fast delay | all fast devices invoked |
| D6 | IP1 produces slow delay | IP2 produces fast delay | slow IP1-N/-P devices fast IP2-N and IP2-P devices invoked |
| D7 | IP1 produces slow delay | IP2 produces slow delay | no fast devices invoked, slowest case |

Table 2 indicates that eight combinations of six $B_1$–$B_6$ signals are preferably produced by combinational logic 10 from the various $A_1$–$A_3$ matrix-produced combinations, which programmed states cause circuit 8 to provide the delays D0–D7.

TABLE 2

| $A_1$ | $A_2$ | $A_3$ | DELAY STATE | $B_1$ | $B_2$ | $B_3$ | $B_4$ | $B_5$ | $B_6$ |
|---|---|---|---|---|---|---|---|---|---|
| 0 | 0 | 0 | D0 | 1 | 0 | 0 | 0 | x | x |
| 0 | 0 | 1 | D1 | 0 | 0 | 1 | 1 | x | 1 |
| 0 | 1 | 0 | D2 | 0 | 0 | 1 | 1 | x | 0 |
| 0 | 1 | 1 | D3 | 0 | 1 | 1 | 0 | 1 | x |
| 1 | 0 | 0 | D4 | 0 | 1 | 1 | 0 | 0 | x |
| 1 | 0 | 1 | D5 | 0 | 1 | 0 | 0 | 1 | 1 |

TABLE 2-continued

| $A_1$ | $A_2$ | $A_3$ | DELAY STATE | $B_1$ | $B_2$ | $B_3$ | $B_4$ | $B_5$ | $B_6$ |
|---|---|---|---|---|---|---|---|---|---|
| 1 | 1 | 0 | D6 | 0 | 1 | 0 | 0 | 1 | 0 |
| 1 | 1 | 1 | D7 | 0 | 1 | 0 | 0 | 0 | 0 |

Consider first, how the various $A_1$, $A_2$, $A_3$ signals create the various time delays. In the D0 state, where minimum delay is required, the master clock input signal bypasses both IP1 and IP2, and is coupled by transmission gate TG1 to the delayed clock output port. In this minimum delay case, transmission gate TG2, coupled to B2, $\overline{B2}$ and transmission gate TG3, coupled to B4 and $\overline{B4}$ are both open, isolating the delayed clock output port from the remainder of the circuit of FIG. 3.

In similar fashion, by following the effect of the different combinations of logic signals $B_1$–$B_6$ upon the multiplexer transmission gates and MOS devices in FIG. 3, the results summarized in Table 1 will be seen to be correct. By appropriately sizing the W/L ratios of the MOS devices comprising IP1, IP1-P, IP1-N, IP2, IP2-P, IP2-N, the range and granularity of the delay can be variably controlled.

The design of combinational logic is known in the art. For example, in Table 2, signal $B_1$ could be produced by taking the logical NOR of $A_1$, $A_2$, $A_3$. Signal $B_2$ could be produced by first taking the logical AND of $A_2$, $A_3$, and coupling that intermediate signal to an OR gate that also receives as an input $A_1$. The output of the OR gate would be signal $B_2$.

If desired, source transistors may be independently controlled in any combination to provide further degrees of design freedom. For example, it may be desired to provide a longer delay in one direction, e.g., when the master clock input signal falls from "1" to "0", and a short delay in the opposite transition case. So doing for the two inverter pair embodiment of FIG. 3 may require additional combinations and/or numbers of control signals.

Figure 4A:
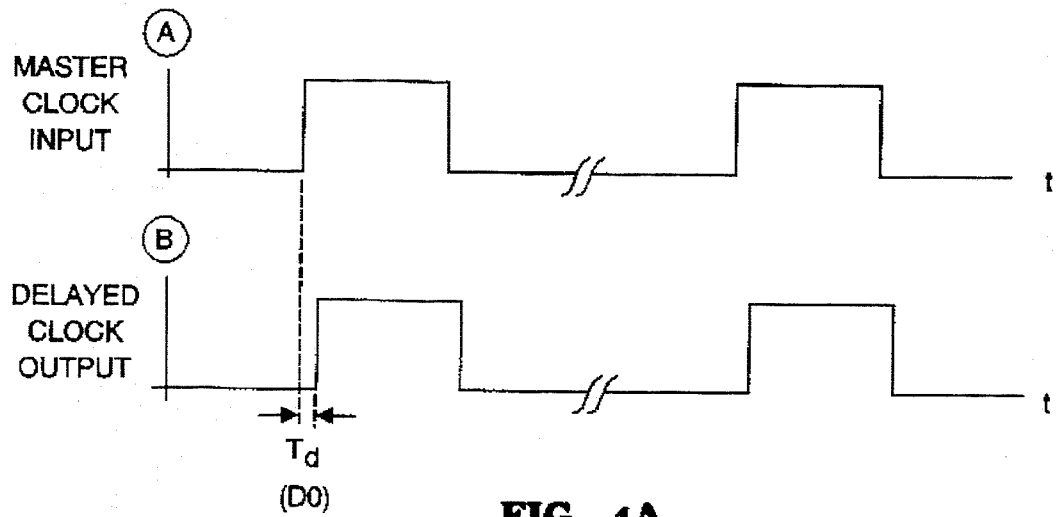
FIGS. 4A, 4B, and 4C depict master clock input waveform A versus delayed master clock output waveform B for programmed delays D0, D3 and D7, according to the present invention.
Figure 4B:
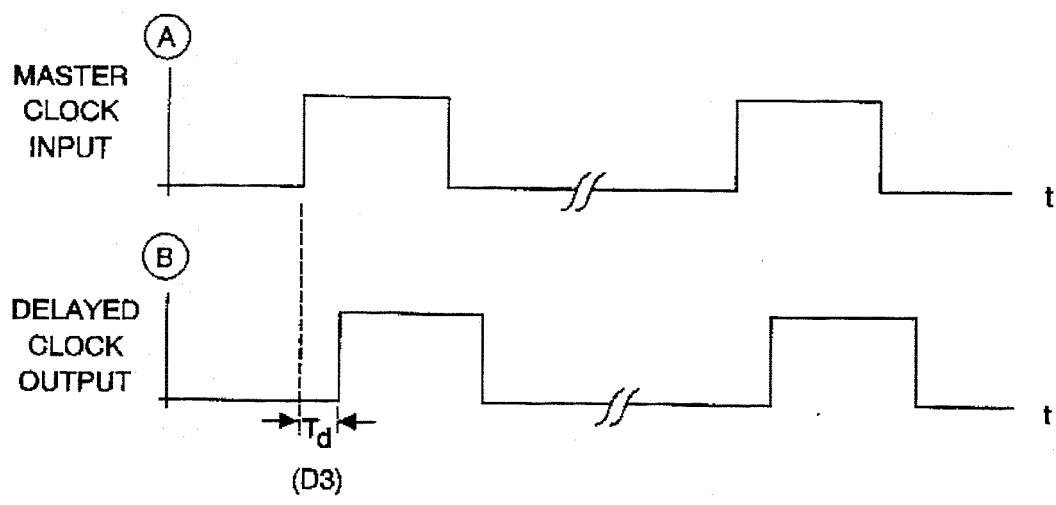
Figure 4C:
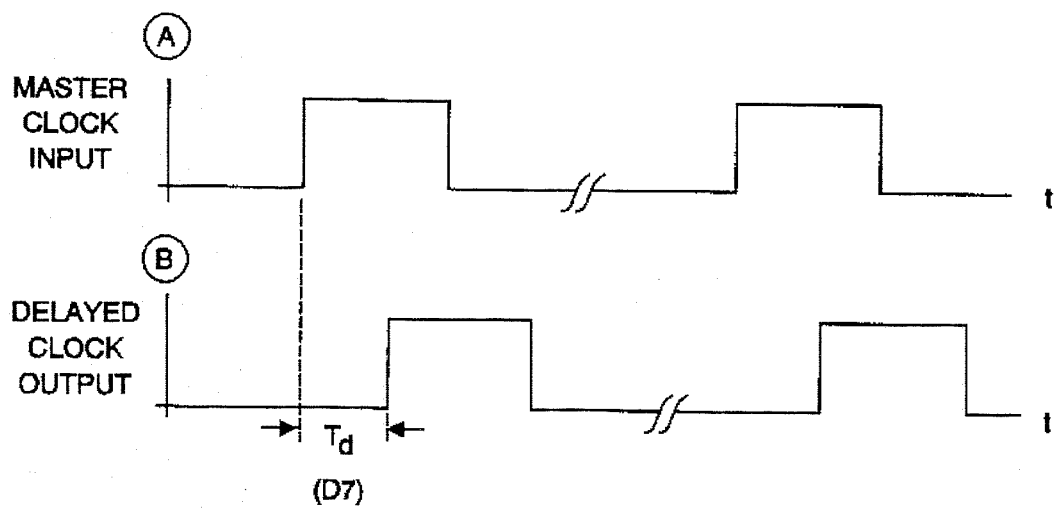

FIGS. 4A, 4B, 4C depict different time delays $T_d$ provided by the present invention, in response to different A1, A2, A3 signals. It is of course understood that if more than eight degrees of resolution are desired between a zero delay (D0) and a maximum delay (D7), matrix 14 will provide more than m=3 output lines, and the variable delay element 8 will provide additional delaying options.

Modifications and variations may be made to the disclosed embodiments without departing from the subject and spirit of the invention as defined by the following claims. For example, although the present invention has been described with reference to delaying a signal for use with a memory sense amplifier circuit, other circuits requiring a precision time delay may benefit from the invention as well. More specifically, the present invention may be used to precisely control the timing of secondary sense amplifiers in memory circuits, or latching input samplers on Synchronous (clocked) ICs of any type, memory or non-memory.

What is claimed is:

1. An on-chip circuit for determining and maintaining a delay between an input signal and an output signal, comprising:

variable delay means, coupled to receive the input signal and at least one programmable delay control signal, for providing after a time delay a delayed version of said input signal as said output signal, said delay determined by said at least one programmable delay control signal; and programming means, coupled to said variable delay means, including means for maintaining said programmable delay control signal in response to at least one programming input signal, said programmable delay control signal fixing said delay and said on-chip circuit being fabricated on an integrated circuit chip that includes at least one circuit coupled to and responsive to said delayed output signal.

2. The circuit of claim 1, wherein said programming means includes a matrix of m programmable elements, each said element capable of maintaining a logical "0" or "1" state.

3. The circuit of claim 2, further including logic means for logically coupling said programmable elements to produce $2^m$ combinations of said programming input signals.

4. The circuit of claim 2, wherein said elements are user blowable fuses, select ones of which are blown to produce said chosen one of a plurality of combinations.

5. The circuit of claim 2, wherein said programming means further includes multiplex means, coupled to said matrix of m elements and coupled to said variable - delay means, for decoupling, upon receipt of a TEST mode signal, said matrix of m elements from said variable delay means and for coupling to said variable delay means one or more user provided input signals;

wherein during said TEST mode signal, said delay is determined by said user provided input signals.

6. The circuit of claim 1, wherein said variable - delay means includes at least a first delay-producing pair of inverter transistors, and at least one transmission gate for selectively bypassing said delay-producing pair;

wherein said input signal passes through said first delay-producing pair and appears as said output signal in a first time delay state, and wherein said input signal bypasses said first delay-producing pair in a second time delay state.

7. The circuit of claim 6, further including a delay-altering transistor switchably coupled in parallel to a transistor in said first delay-producing pair, said delay-altering transistor responding to a said programming input signal to alter a time delay produced by said first delay-producing pair.

8. The circuit of claim 1, wherein said at least one circuit includes a memory sense amplifier.

9. A method for determining and maintaining a delay between an input signal on an integrated circuit chip and an output signal on the integrated circuit chip said chip including at least one circuit coupled to and responsive to said delayed output signal, the method comprising the following steps:

providing variable delay means on said integrated circuit chip, coupled to receive the input signal and at least one programmable delay control signal, for providing after a time delay a delayed version of said input signal as said output signal, said delay being determined by said at least one programmable delay control signal;

providing programming means on said integrated circuit chip, coupled to said variable delay means, for maintaining said programmable delay control signal in response to at least one programming input signal, said programmable delay control signal fixing said delay of said output signal to said responsive circuit.

10. The method of claim 9, wherein said step of providing programming means includes providing a matrix of m programmable elements, each said element capable of maintaining a logical "0" or "1" state.

11. The method of claim 10, further including the step of logically coupling said programmable elements to produce $2^m$ combinations of said programming input signals.

12. The method of claim 10, wherein said programmable elements are user blowable fuses, select ones of which are blown to produce said chosen one of a plurality of combinations.

13. The method of claim 9, wherein said integrated circuit chip requires at least two different time delays, and wherein said step of providing variable delay means includes providing at least two said variable delay means, and wherein said step of providing programming means includes providing at least one said programming means.

14. The method of claim 9, wherein said step of providing programming means further includes providing multiplex means, coupled to said variable delay means, for decoupling, upon receipt of a TEST mode signal, said means for maintaining from said variable delay means and for coupling to said variable delay means a plurality of user provided combinations of programming input signals;

wherein during said TEST mode signal, said delay is determined by said user provided combinations of programming input signals.

15. The method of claim 9, wherein said variable - delay means includes at least a first delay-producing pair of inverter transistors, and at least one transmission gate for selectively bypassing said delay-producing pair;

wherein said input signal passes through said first delay-producing pair and appears as said output signal in a first time delay state, and wherein said input signal bypasses said first delay-producing pair in a second time delay state.

16. The method of claim 15, wherein said variable delay means includes a delay-altering transistor switchably coupled in parallel to a transistor in said first delay-producing pair, said delay-altering transistor responding to a said programming input signal to alter a time delay produced by said first delay-producing pair.

17. The method of claim 9, including the additional step of providing said integrated circuit chip with metallization default programming means, coupled to said variable delay means, for programming a time delay according to a metallization pattern on said integrated circuit chip.

18. The method of claim 17, wherein said metallization default programming means is programmed according to a criterion selected from the list consisting of (a) minimizing programming required during said step of providing programming means, and (b) providing a default time delay that matches a delay actually required by a substantial number of mass-produced said integrated circuit chips according to actual historical data.

19. The method of claim 9, wherein said circuit on said integrated circuit chip includes at least one sense amplifier coupled to receive said output signal.

* * * * *